United States Patent [19]

Chevillat et al.

[11] Patent Number: 4,490,807

[45] Date of Patent: Dec. 25, 1984

[54] ARITHMETIC DEVICE FOR CONCURRENTLY SUMMING TWO SERIES OF PRODUCTS FROM TWO SETS OF OPERANDS

[75] Inventors: Pierre R. Chevillat, Adliswil; Hans P. Käser, Thalwil; Dietrich G. U. Maiwald, Wädenswil; Gottfried Ungerböck, Langnau, all of Switzerland

[73] Assignee: International Business Machines Corporation, Armonk, N.Y.

[21] Appl. No.: 556,760

[22] Filed: Dec. 1, 1983

Related U.S. Application Data

[63] Continuation of Ser. No. 270,447, Jun. 4, 1981, abandoned.

[30] Foreign Application Priority Data

Jun. 24, 1980 [EP] European Pat. Off. ........ 80103546.0

[51] Int. Cl.³ .............................................. G06F 7/48
[52] U.S. Cl. .................................................. 364/736
[58] Field of Search ....................... 364/736, 728, 724

[56] References Cited

U.S. PATENT DOCUMENTS

| | | | |
|---|---|---|---|
| 3,508,038 | 4/1970 | Goldschmidt et al. | 364/757 |
| 3,748,451 | 7/1973 | Ingwersen | 364/728 |
| 3,805,045 | 4/1974 | Larsen | 364/787 |
| 3,840,727 | 10/1974 | Amdahl et al. | 364/760 |
| 3,840,861 | 10/1974 | Amdahl et al. | 364/200 |
| 4,202,039 | 5/1980 | Epenoy et al. | 364/757 |

Primary Examiner—David H. Malzahn
Attorney, Agent, or Firm—Robert W. Berray

[57] ABSTRACT

In a signal processor computing arrangement comprising an ALU (11) and a multiplier (21), two selectively usable accumulators (37, 41) and gating circuitry (61, 63) are provided to allow alternating computation and accumulation of product terms for two output values with sets of input values that overlap. This saves memory accesses by using the same operand twice for different output values, and requires only one processor cycle per partial term and output value. A specific pipeline multiplier (21) is provided consisting of two partial sections (29, 31) with an intermediate pipeline register (33) to allow applying a second set of input operands while computation of the product of a first set of operands is still in progress.

3 Claims, 4 Drawing Figures

ARITHMETIC DEVICE FOR CONCURRENTLY SUMMING TWO SERIES OF PRODUCTS FROM TWO SETS OF OPERANDS

This is a continuation of application Ser. No. 270,447 filed June 4, 1981 now abandoned.

BACKGROUND OF THE INVENTION

1. Field of the Invention

The present invention is concerned with a signal processor computing arrangement, and with a method of cyclically operating said computing arrangement for separately summing up two series of products with overlapping sets of operands.

In many signal processor applications such as computation of digital filter output values, a sequence of products of variable input values and given coefficients has to be accumulated for each such output value. While the set of coefficients may remain constant, the set of input values is shifted for subsequent output values, i.e., the leading input value is cancelled and a new trailing input value is added. Thus, for subsequent output values, overlapping sets of operands are used.

Microprocessors are particularly useful for signal processing applications because they can be incorporated in respective equipment.

A general description of such microprocessors was given in the paper "Microprocessors" by H. M. D. Toong, published in Scientific American, September 1977, pp. 146-161. Above-mentioned operations can be performed on these general purpose microprocessors which are also suited for all other kinds of data processing operations.

2. Description of Prior Art

Microprocessors which are specifically suited for signal processing applications were recently disclosed in two publications.

One of them entitled "V-MOS Chip Joins Microprocessor to Handle Signals in Real Time" by R. W. Blasco, appeared in Electronics on Aug. 30, 1979, pp. 131-138. The described processor provides an adder/-subtractor unit and an additional multiplier which allow sequential multiplication and adding/subtracting operations. The required multiplication unit, however, is a very high-speed multiplier because it must provide a product of two operands within one cycle. Operands for subsequent computations have to be fetched from memory each time they are used again.

Another publication "Packaging a Signal Processor Onto a Single Digital Board" by L. Schirm, Electronics, Dec. 20, 1979 describes a processor using specific multiplier-accumulator units. A parallel arrangement of several such units allows the parallel generation of subsequent output values, using each input value in several computations. Several accumulating, i.e., adding/subtracting units and several high-speed multipliers have to be dedicated to this arrangement. Furthermore, this equipment is not available for other necessary general processing operations.

SUMMARY OF THE INVENTION

It is one object of the present invention to provide a microprocessor computing arrangement that can be used for all kinds of data processing and arithmetic operations, but is also particularly suited for signal processing computations requiring product accumulations.

It is a further object to devise a computing arrangement with a single arithmetic-logic unit and a single multiplier that allows to use each operand for more than one output value, thus saving memory accesses.

A further object is to provide a signal processor computing arrangement comprising a separate hardware multiplier that allows to apply a new operand pair and to obtain a product in each successive machine cycle but need not be as fast as to completely compute each product within one machine cycle.

Another object of the invention is to devise a method of operating a signal processor computing arrangement to effectively compute two subsequent but separate output values by using each operand twice.

These objects of the present invention are achieved by a signal processor in which successive sets of input operands and intermediate results partially overlap so that the same input (intermediate) value is used twice, but with a different input (intermediate) value. The signal processor comprises an arithmetic unit and a multiplier operable for parallel operation and includes a pair of arithmetic output registers or accumulators. With this arrangement, each value can be used twice without intermediate storing or refetching. Thus, the operational speed is significantly increased.

The inventive computing arrangement and method, as defined in the claims, needs neither a very high-speed multiplier, nor a separate computing section for each of the simultaneously processed output values. By saving many memory accesses it allows a high through-put despite modest requirements for the arithmetic hardware.

An embodiment of the invention is described in the following in connection with drawings.

DESCRIPTION OF THE PREFERRED EMBODIMENT

Figure 1:
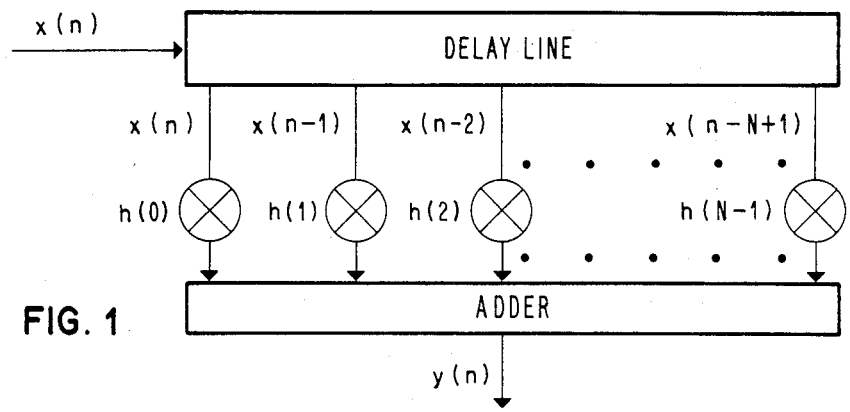
FIG. 1 is a schematic representation of a digital filter for illustrating a typical application of the invented computing arrangement and method.

FIG. 1 shows in schematic form a digital filter which is a typical application of signal processing in which successive output values are generated by accumulating the sum of a plurality of products for each output value, and in which the sets of input values for successive output values overlap. A plurality of successive input values $x(n) \ldots x(n-[N-1])$ are stored in a delay line, and each has to be multiplied by an associated coefficient $h(0) \ldots h(N-1)$. All products are added to obtain the output value $y(n)$.

This can be generally written in the form:

$$y(n) = \sum_{k=0}^{N-1} h(k) * x(n-k) \qquad (1)$$

$y(n)$ is the output value at time n. For successive output values, the set of input values is shifted by one step (the oldest input value deleted and a new one added), while the coefficients remain the same.

The previous output value with respect to the one shown in (1), i.e., the output value for time n−1, can be written as $$y(n-1) = \sum_{k=0}^{N-1} h(k) * x(n-1-k) \quad (2)$$

Each of the output values has to be computed in N steps, and in each step one product is added to the previous intermediate result to obtain a new intermediate result, which can be written generally for the k-th step as $$y(n)^{k-1} + h(k) * x(n-k) \rightarrow y(n)^k \quad (3)$$

wherein $y(n)^k$ is the intermediate result after the k-th step, $y(n)^0 = \text{INIT}$ is the initial value for the first step, and $y(n)^N = y(n)$ is the final output value after the N-th step.

It is now suggested by the invention to perform these computational steps for pairs of successive output values such as y(n) and y(n−1) shown in (1) and (2) in an interleaved manner, as illustrated in the sequence below, and to use a specifically suited computing arrangement for performing these interleaved computing steps.

| ... | + ... | * ... | → ... | (4) |
|---|---|---|---|---|
| $y(n)^{k-1}$ | + h(k) | * x(n − k) | → $y(n)^k$ | |
| $y(n-1)^{k-1}$ | + h(k) | * x(n − 1 − k) | → $y(n-1)^k$ | |
| $y(n)^k$ | + h(k+1) | * x(n − 1 − k) | → $y(n)^{k+1}$ | |
| $y(n-1)^k$ | + h(k+1) | * x(n − 2 − k) | → $y(n-1)^{k+1}$ | |
| ... | + ... | * ... | → ... | |

The specific ordering of partial steps shown in (4) reveals that for the products in successive steps, only one of the operands need to be changed after each step. Two separate intermediate results have to be kept during the series of steps for a pair of output values, until the final values are available. Thereafter, a new series of interleaved computing steps is started for another pair of output values.

Thus, if the filter has e.g., eight taps and eight coefficients, the computation of the first two output values y(1) and y(2) will be made in 16 interleaved steps. Thereafter, the next two output values y(3) and y(4) are computed in another series of 16 interleaved steps, and so forth.

Figure 2:
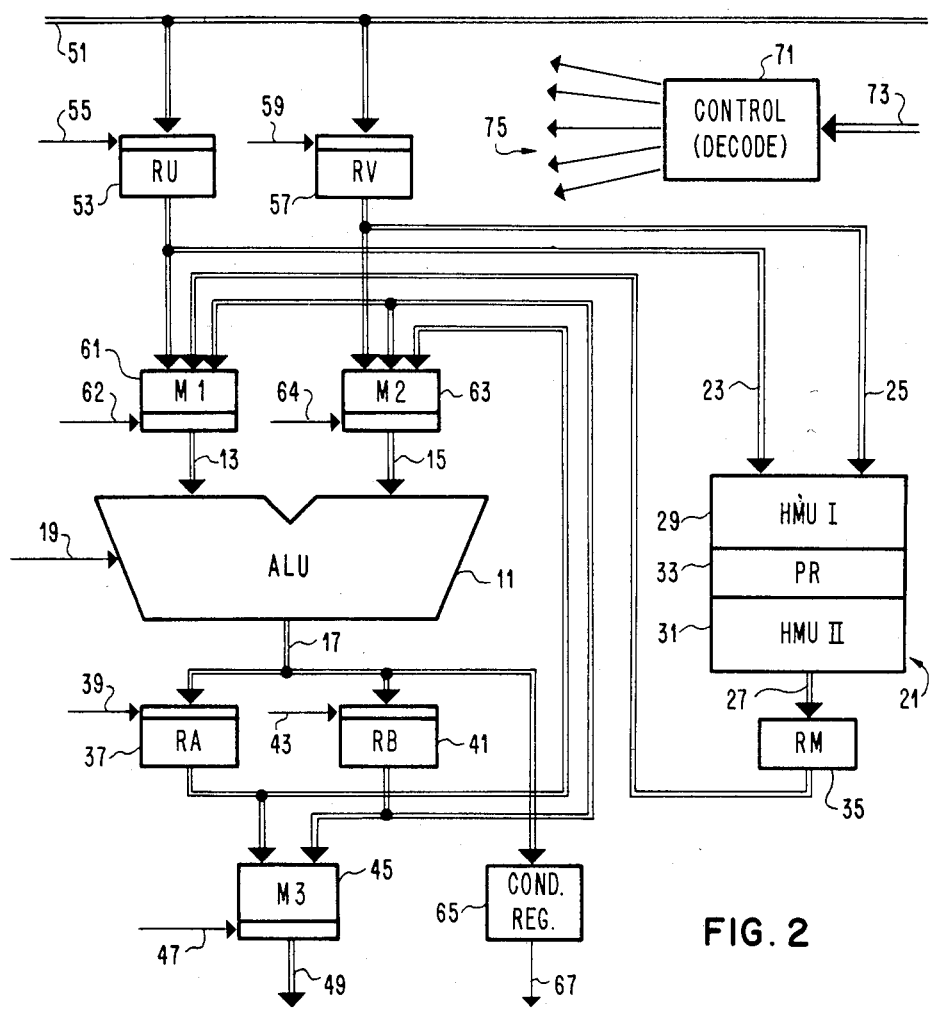
FIG. 2 is a block diagram of the invented signal processing computing arrangement.

A computing arrangement which is a preferred embodiment of the invention and which is very suitable for performing these series of interleaved computing steps is shown in form of a block diagram in FIG. 2. It fits into a signal processor environment that will be described in connection with FIG. 3.

The computing arrangement of FIG. 2 comprises an arithmetic-logic unit (ALU) 11 of well-known design for performing at least adding, subtracting and logical operations. It has two operand inputs 13 and 15, and a result output 17, all e.g. 16 bit wide (of course, other data path width such as 8 bits or 12 bits could be chosen). A control input 19 is provided for a number of parallel control bits to select the operation to be performed by ALU 11.

The computing arrangement further comprises a hardware multiplier unit (HMU) 21 which has two operand inputs 23 and 25, and a result output 27, all 16 bit wide (or any other width chosen as indicated in the previous section). The multiplier consists of two sections 29 (I) and 31 (II), and a pipeline register (PR) 33 for intermediate results. The multiplier unit operates in a pipelined fashion as follows: While section I generates intermediate results using the two operands available at inputs 23 and 25, section II processes the intermediate results available in register 33, which are based on the previous operand pair that was furnished to inputs 23 and 25, and generates from these the final product. At the end of one machine cycle, intermediate results from section I are stored in PR33, while the final product from section II is furnished at output 27 and stored into a multiplier output register (RM) 35. Thus, in each machine cycle, a new operand pair can be applied to the inputs, and their product becomes available at the multiplier output and in RM 35 after a delay of two machine cycles. A few more details of the multiplier unit are described at the end of this specification.

Two accumulator registers RA and RB are connected to ALU output 17. RA register 37 can be selectively loaded by a signal on control line 39, and RB register 41 can be selectively loaded by a signal on control line 43. Multiplexer 45 (M3) furnishes the contents of either register RA or register RB to output lines 49 depending on a control signal on line 47.

Figure 3:
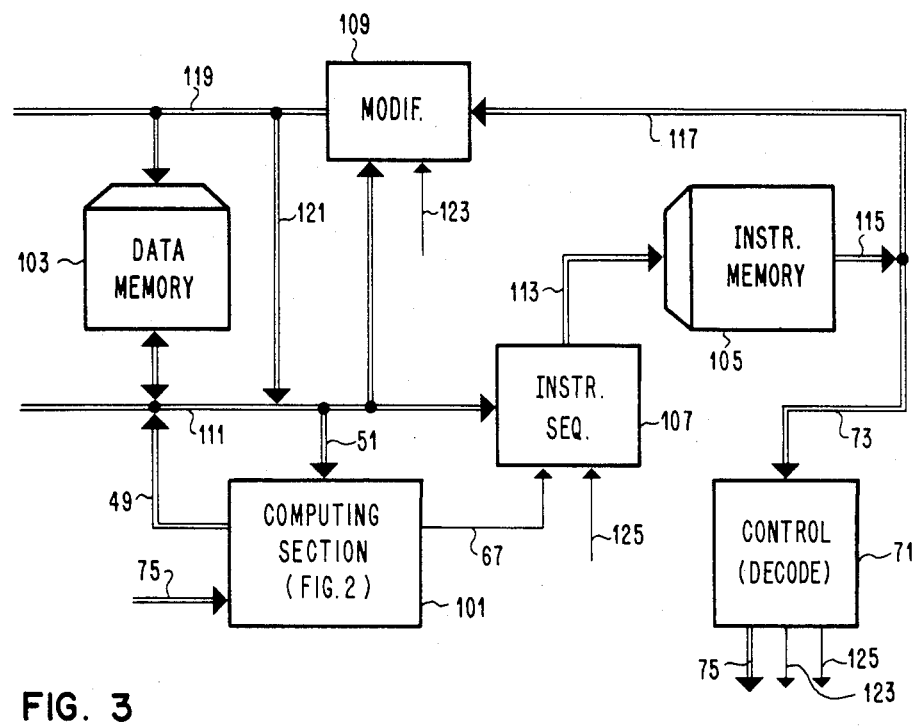
FIG. 3 is a block diagram of a typical signal processor in which the computing arrangement of FIG. 2 is used.

Two input registers RU and RV are connected to input lines 51 which are a branch of the signal processor's data bus (as shown in FIG. 3). RU register 53 can be selectively loaded by a signal on control line 55, and RV register 57 can be selectively loaded by a control signal on line 59.

Two multiplexers 61 (M1) and 63 (M2) are connected to ALU inputs 13 and 15, respectively. Each has three inputs: Inputs of multiplexer M1 are connected to the outputs of registers RM (35), RB (41), and RU (53) respectively. One of the inputs is gated to ALU input 13 in response to control bits on lines 62. Inputs of multiplexer M2 are connected to the outputs of registers RA (37), RB (41), and RV (57) respectively. One of these inputs is gated to ALU input 15 in response to control bits on lines 64.

The output of RU register 53 is also connected to the first input 23 of multiplier 21 (HMU), and the output of RV register 57 is also connected to the second input 25 of multiplier 21.

A condition register 65 is connected to output 17 of ALU 11. It provides a branch indicator signal on line 67 reflecting the present status of the ALU output value, i.e., whether it is positive, zero, negative, or whether an overflow occurred, etc.

A control unit 71 including a decoder receives the OP code of the presently executed instruction on lines 73 and provides decode signals for the various functional units on control lines 19, 39, 43, 47, 55, 59, 62 and 64, which are commonly designated as output lines 75 of control unit 71. Timing signals defining machine cycles and subcycles are furnished to all functional units to achieve their synchronous operation. They are not shown explicitly.

It is to be noted that in the present embodiment, multiplier 21 operates continuously independent of the executed instructions and the current decoder signals, so that in each machine cycle a value becomes available in RM register 35, which is the product of two operands that were stored two machine cycles previously in RU register 53 and RV register 57, respectively.

The computing arrangement of FIG. 2 is well suited for performing operation step sequence (4) shown above, because one can use RA register 37 and RB register 41 alternatingly to accumulate two separate result values y(n) and y(n−1); one input value to the multiplier can be changed in every cycle while the other remains for one more cycle, e.g. h(k)-values in RV register 57; and each product of the sequence of products obtained from multiplier 21 belongs alternatingly to one or the other of the two results currently accumulated in the computing arrangement. A detailed example will be explained in a later section.

FIG. 3 schematically illustrates the environment, i.e., a signal processor in which the inventive computing arrangement can be used. It comprises a computing section 101 that is equal to the computing arrangement of FIG. 2, a data memory 103, an instruction memory 105, instruction sequencer 107, modification circuitry 109, and the control unit 71 already shown in FIG. 2. A bidirectional data bus 111 interconnects data memory 103, computing section 101 (via branches 49 and 51), instruction sequencer 107 and modification circuitry 109. Instruction address lines 113 are provided between instruction sequencer 107 and instruction memory 105. Output of instruction memory 105 is an instruction bus 115. Branch 73 of this instruction bus is connected to control unit 71 for transferring OP code information, and branch 117 is connected via modification circuitry 109 to a memory address bus 119 for providing operand address information from the current instruction to data memory 103. Lines 121 connect memory address bus 119 to data bus 111 to allow transfer of immediate operands.

Under control of instruction sequencer 107, instructions are sequentially read from instruction memory 105. They control the reading and writing of data memory 103 and their transfer from and to computing section 101 and other units, and they further control via control lines 75 the operations performed by computing section 101, and via other control lines such as 123 and 125 the operations performed by other units. By a signal on branch condition line 67, the current result obtained in the ALU of the computation section can vary the sequence of instructions with the aid of instruction sequencer 107. Operation of such signal processor is well known from microprocessor technology so that no further explanation is necessary.

Detailed operation of the computing section 101 will now be explained for an example in connection with FIG. 2.

Figure 4:
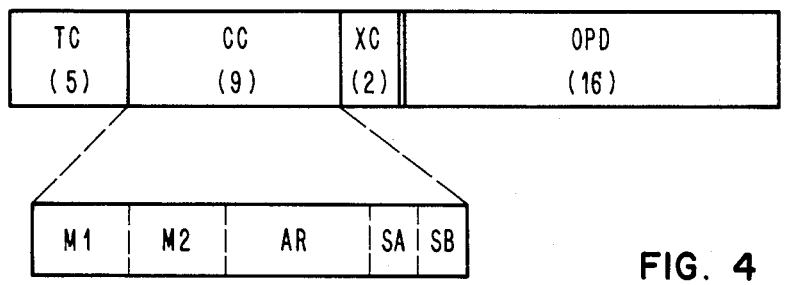
FIG. 4 is the instruction format used in the signal processor of FIG. 3, including a computation code field for controlling operation of the computing arrangement of FIG. 2.

The instruction format used in the present embodiment is shown in FIG. 4. Each instruction comprises two sections, an operation code section and an operand section. The operation code section includes a transfer code TC for controlling data paths and gates, a separate computation code CC for controlling the operation of the ALU, and some extra control bits XC for special purposes. Computation code CC is subdivided into five subsections for controlling following functions: M1=Selection Multiplexer 1, M2=Selection Multiplexer 2, AR=ALU arithmetic operation, SA=Storing into RA, SB=Storing into RB. The operand Section OPD contains an operand address, or it may contain a direct operand.

The instruction set provides a large number of different instruction codes for the operation code section, but only a few that are necessary for a little sequence of steps explaining the invention are listed here.

| | | Selected Processor Instructions: |
|---|---|---|
| (TC) | | LMU = Load <OPD> into RU |
| | | LMV = Load <OPD> into RV |
| | | SAM = Store <RA> into memory |
| | | SBM = Store <RB> into memory |
| (CC) | (M1) | GRM = Gate <RM> into ALU input 1 |
| | (M2) | GRA = Gate <RA> into ALU input 2 |
| | | GRB = Gate <RB> into ALU input 2 |
| | (AR) | ADD = Add operands from ALU inputs 1 and 2 |
| | | IN1 = Produce initial value 1 at ALU output |
| | | IN2 = Produce initial value 2 at ALU output |
| | (SA) | SRA = Store ALU output into RA |
| | | NOT = Don't change <RA> |
| | (SB) | SRB = Store ALU output into RB |
| | | NOT = Don't change <RB> |

(In the listing above, <x> means contents of memory location or register x.)

For explaining operation of the computing arrangement described above, equation (1) is further simplified to the form $$f(n) = \sum_{k=0}^{3} c(k) * x(n - k) \qquad (5)$$

This means that a number of function values f(n) have to be computed, each being the accumulated sum of four products $c(0)*x(n) + \ldots + c(3)*x(n-3)$.

As was mentioned above already, computations are made for pairs of function values in an interleaved manner. Each such computation cycle could be called a batch, and the computation sequence is illustrated in the following example for some selected subsequent batches:

3rd Batch
f(5) = x(5)·c(0) + x(4) · c(1) + x(3) · c(2) + x(2) · c(3)
f(4) =        c(0) · x(4) + c(1) · x(3) + c(2) · x(2) + c(3)·x(1)

4th Batch
f(7) = x(7)·c(0) + x(6) · c(1) + x(5) · c(2) + x(4) · c(3)
f(6) =        c(0) · x(6) + c(1) · x(5) + c(2) · x(4) + c(3)·x(3)

5th Batch
f(9) = x(9)·c(0) + ...
f(8) =        c(0) · x(8) + ...

Below, a short sequence is listed for computing one batch, i.e., two function values, in the computing arrangement of FIG. 2.

| STEP | TC | M1 | M2 | AR | SA | SB | OPD |
|------|-----|------|------|------|------|------|---------|
| (1) | LMU | | | IN1 | SRA | NOT | XXX + 0 + n |
| (2) | LMV | | | IN2 | NOT | SRB | CCC + 0 |
| (3) | LMU | | | — | | | XXX − 1 + n |
| (4) | LMV | | | — | | | CCC + 1 |
| (5) | LMU | GRM | GRA | ADD | SRA | NOT | XXX − 2 + n |
| (6) | LMV | " | GRB | " | NOT | SRB | CCC + 2 |
| (7) | LMU | " | GRA | " | SRA | NOT | XXX − 3 + n |
| (8) | LMV | " | GRB | " | NOT | SRB | CCC + 3 |
| (9) | LMU | " | GRA | " | SRA | NOT | XXX − 4 + n |

-continued

| STEP | TC  | M1 | M2  | AR | SA  | SB  | OPD        |
|------|-----|----|-----|----|-----|-----|------------|
| (10) | —   | "  | GRB | "  | NOT | SRB | —          |
| (11) | —   | "  | GRA | "  | SRA | NOT | —          |
| (12) | —   | "  | GRB | "  | NOT | SRB | —          |
| (13) | SAM |    | —   |    |     |     | FFF + 0 + n |
| (14) | SBM |    | —   |    |     |     | FFF − 1 + n |

XXX = Address of x(0)    XXX + u = Address of x(u)
CCC = Address of c(0)    CCC + u = Address of c(u)
FFF = Address of f(0)    FFF + u = Address of f(u)

Comments:
Step (1) x(n) is loaded into RU. RA is initialized.
Step (2) c(0) is loaded into RV. RB is initialized.
Step (3) c(0)*x(n) is processed in multiplier section I. x(n − 1) is loaded into RU.
Step (4) c(0)*x(n − 1) is processed in multiplier section I. c(0)*x(n) is processed in multiplier section II. c(1) is loaded into RV.
Step (5) c(0)*x(n) is added to <RA>, result into RA. c(1)*x(n − 1) is processed in multiplier section I. c(0)*x(n − 1) is processed in multiplier section II. x(n − 2) is loaded into RU.
... a.s.f.
Step (11) c(3)*x(n − 3) is added to <RA>, result into RA.
Step (12) c(3)*x(n − 4) is added to <RB>, result into RB.
Step (13) <RA> is stored into memory as f(n).
Step (14) <RB> is stored into memory as f(n − 1).

For each subsequent batch computation, the value of n and thus all x-addresses (input values) and the f-addresses (output values) will be increased by two units (+2) by means of index operations.

In the above example, only four products had to be accumulated for each output value. This small number was chosen to simplify the illustration and understanding of the example. In reality, much more coefficients and input values are required for each output value, because filters may have 64 (or even much more taps and coefficients. Thus while in the above example efficiency appears to be low because of many initial and final steps without computation or memory access, each practical application with a high number of coefficients (taps), i.e. computing steps, asymptotically approaches a value of one processor cycle per coefficient (tap) and output value, which can be considered the maximum possible efficiency.

OTHER APPLICATION EXAMPLE

The filter example of FIG. 1 and the function values in equations (1) and (2) were considered with real-valued quantities only. The described computing arrangement and method are also well suited for computing output value sequences of complex-valued quantities. In this case, the two values computed in each batch in an interleaved fashion are a real value and the associated imaginary value, according to the following equations:

$$fr(n) = \sum_{k=0}^{N-1} cr(k) * xr(n - k) - ci(k) * xi(n - k) \quad (6)$$

$$fi(n) = \sum_{k=0}^{N-1} cr(k) * xi(n - k) + ci(k) * xr(n - k) \quad (7)$$

Only the first steps of a sequence for calculating a complex value pair are shown below:

| STEP | TC  | M1  | M2  | AR  | SA  | SB  | OPD         |
|------|-----|-----|-----|-----|-----|-----|-------------|
| (1)  | LMU |     |     | IN1 | SRA | NOT | XXR + 0 + n |
| (2)  | LMV |     |     | IN2 | NOT | SRB | CCR + 0     |
| (3)  | LMU |     |     |     |     |     | XXI +       |
| (4)  | LMV |     |     |     |     |     | CCI + 0     |
| (5)  | LMU | GRM | GRA | ADD | SRA | NOT | XXR + 0 + n |
| (6)  | LMU | "   | GRB | ADD | NOT | SRB | XXR − 1 + n |
| (7)  | LMV | "   | GRA | STR | SRA | NOT | CCR + 1     |
| (8)  | LMU | "   | GRB | ADD | NOT | SRB | XXI − 1 + n |
| (9)  | LMV |     |     |     |     |     | CCI + 1     |
| (10) | LMU | GRM | GRA | ADD | SRA | NOT | XXR − 1 + n |
| (11) | LMU | "   | GRB | ADD | NOT | SRB | XXR − 2 + n |
| (12) | LMV | "   | GRA | STR | SRA | NOT | CCR + 2     |
| (13) | LMU | "   | GRB | ADD | NOT | SRB | XXI − 2 + n |
| (14) | LMV |     |     |     |     |     | CCI + 2     |

XXR = Address of xr(0)
XXI = Address of xi(0)
CCR = Address of cr(0)
CCI = Address of ci(0)

As can be seen from this initial part of a computation sequence, five computing steps or processor cycles are required for each complex pair of coefficients cr(k) and ci(k) in a batch calculation for a complex pair of output values fr(n) and fi(n).

Alternatively, in one batch two successive real filter outputs can be computed, and in the next batch the associated two successive imaginary filter outputs. This requires only four processor cycles per complex filter output pair and complex coefficient pair.

FURTHER POSSIBLE APPLICATIONS

The invented computing arrangement and interleaved method of operation can be used for numerous other applications in which processing steps can be arranged in such a way that changing only one of the operands at the multiplier input in any cycle leads to a sequence of required products. Examples are adjustment of real and complex filter coefficients, computation of autocorrelation functions, and evaluation of Fast Fourier Transform "butterflies".

SOME MORE DETAILS OF THE HARDWARE MULTIPLIER UNIT

In principle, multiplier unit 21 shown in FIG. 2 could be a very fast hardware multiplier furnishing at its output the product of two input values within one processor cycle. This would also allow to change one input value in each processor cycle. Such a fast hardware multiplier, however, is rather expensive which is not desirable for many signal processor applications.

Thus, a preferred form of multiplier unit 21 is a pipelined multiplier in two sections with an intermediate pipeline register, as already described above. Both sections together are an asynchronously operating network that logically combines the set of input bits representing two operands into one set of output bits representing the product. While multiplier networks in principle are well known (some examples are, e.g., given in the publication, "Real-time Processing Gains Ground With Fast Digital Multiplier" by S. Waser et al., Electronics, Sept. 29, 1977, pp. 93–99), this network here is partitioned in such a way that the set of bits appearing at the output lines of section I after one machine cycle can be clocked into a pipeline register and used as set of input bits for the input lines of section II for further logical combination to obtain the set of product bits of the output within one further machine cycle.

A subdivision of the multiplier into m sections with m−1 intermediate pipeline registers is possible in principle. This would allow to use even slower logic circuitry, but would involve a delay of m cycles between application of two operands at the inputs and furnishing of their product at the output.

From the above description of the embodiments of the present invention, it should be obvious to those skilled in the art that many changes can be made in the above embodiments of the invention without departing from the spirit of the invention and the scope of the claims.

Having thus described our invention, what we claim as new, and desire to secure by Letters Patent is:

1. Signal processor computing arrangement comprising:
   a data source;
   an arithmetic unit having two inputs and an output for performing at least add and substract operations;
   a multiplier unit operating simultaneously with said arithmetic unit including two inputs and an output register, said output register receiving and storing a final product of the multiplication of a multiplicand and multiplier successively received on said two inputs;
   two accumulator registers connected to said output of said arithmetic unit, said two accumulator registers including control means for selectively loading an alternate one of said two accumulator registers with successive outputs from said arithmetic unit output;
   two input registers having outputs connected, respectively, to the two inputs of said multiplier unit, said two input registers including other control means for selectively loading said two input registers from said data source; and
   gate means, including means for gating data from a selectable and alternate one of said two accumulator registers to one of said arithmetic unit inputs, and for simultaneously gating the final product from said multiplier output register to the other of said arithmetic unit inputs;
   whereby two separate sum of products are developed in said two accumulator registers.

2. The signal processor of claim 1, in which said gate means includes selective gating means for connecting said outputs of said input registers to said arithmetic unit inputs.

3. The signal processor of claim 1 including a signal processor output, and further gating means for selectively gating data from said two accumulator registers to said signal processor output.

* * * * *